United States Patent
Lin et al.

(10) Patent No.: US 8,809,883 B2
(45) Date of Patent: Aug. 19, 2014

(54) LED LAMP

(71) Applicant: UniLED Lighting Taiwan Inc., New Taipei (TW)

(72) Inventors: Ming-Te Lin, New Taipei (TW); Ming-Yao Lin, New Taipei (TW); Heng Qiu, New Taipei (TW)

(73) Assignee: UniLED Lighting Taiwan Inc., New Taipei (TW)

( * ) Notice: Subject to any disclaimer, the term of this patent is extended or adjusted under 35 U.S.C. 154(b) by 0 days.

(21) Appl. No.: 14/177,655

(22) Filed: Feb. 11, 2014

(65) Prior Publication Data

US 2014/0159080 A1 Jun. 12, 2014

Related U.S. Application Data

(62) Division of application No. 13/231,214, filed on Sep. 13, 2011.

(51) Int. Cl.
*H01L 33/00* (2010.01)

(52) U.S. Cl.
USPC .................... 257/91; 257/98; 257/99

(58) Field of Classification Search
CPC ....................................... F21K 9/00
USPC ......................................... 257/91, 98, 99
See application file for complete search history.

(56) References Cited

U.S. PATENT DOCUMENTS

| | | | |
|---|---|---|---|
| 7,081,667 B2 * | 7/2006 | Du | 257/668 |
| 7,434,964 B1 | 10/2008 | Zheng et al. | |
| 8,168,989 B2 * | 5/2012 | Isobe | 257/88 |
| 2013/0094199 A1 | 4/2013 | Lin et al. | |

* cited by examiner

*Primary Examiner* — Thien F Tran
(74) *Attorney, Agent, or Firm* — Lowe Hauptman & Ham, LLP

(57) ABSTRACT

A LED lamp is disclosed which has a plurality of light unit, each of the light unit has at least one flat metal lead for heat dissipation and the lower part of the metal lead is mounted on a heat sink for a further heat dissipation.

13 Claims, 23 Drawing Sheets

Fig.3A
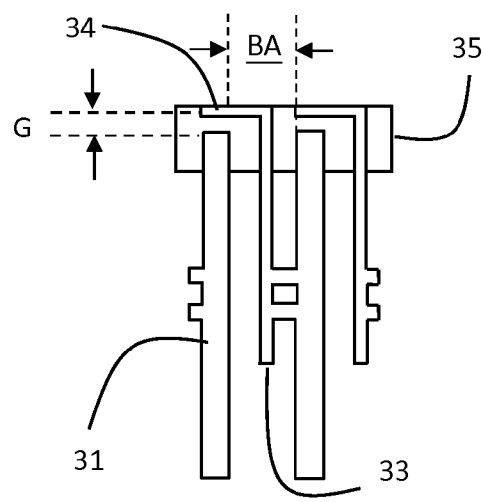
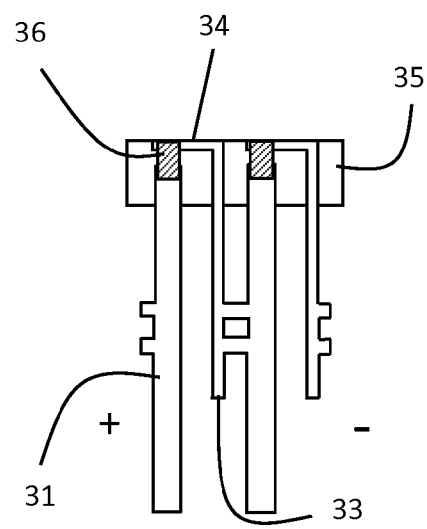
Fig.3B

Fig.4A
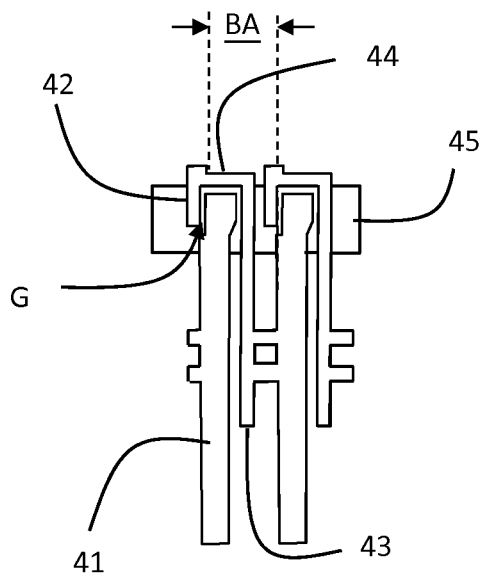
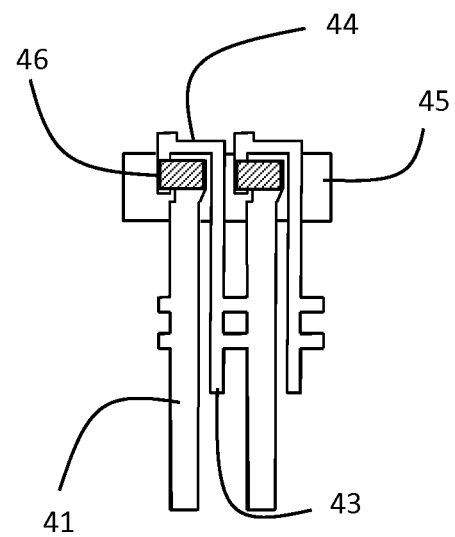
Fig.4B

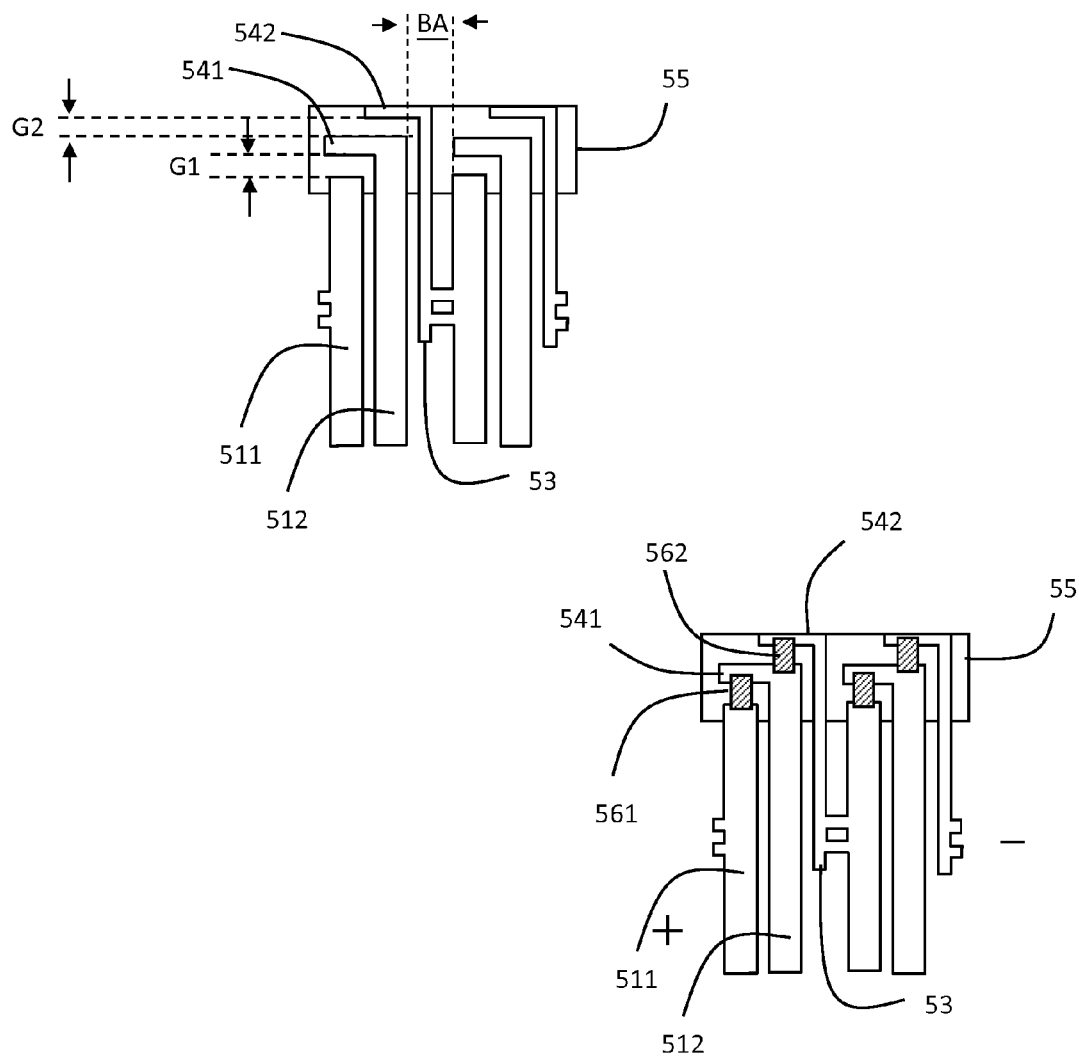

Fig.6A
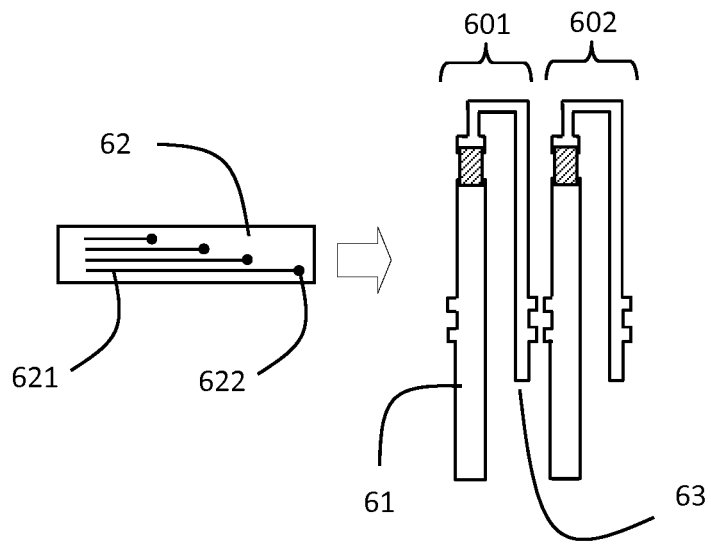
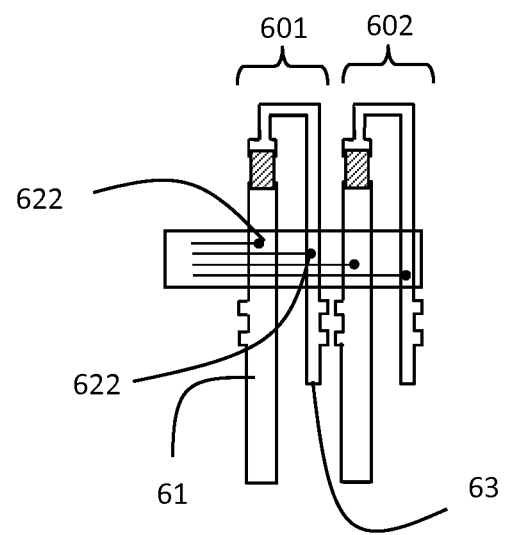
Fig.6B

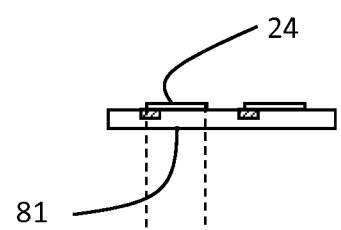
Fig.8A
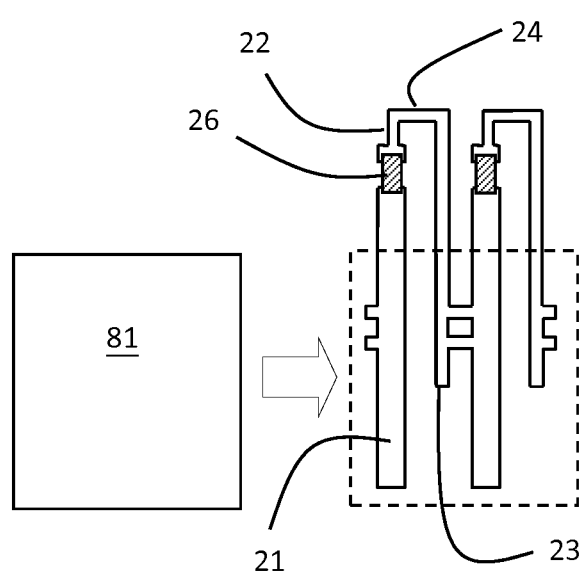
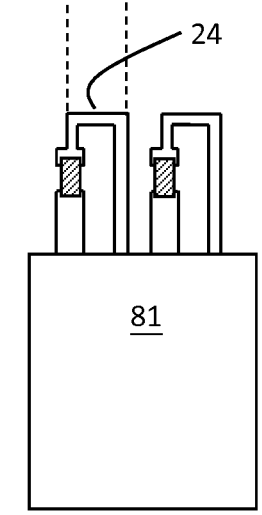
Fig.8B   Fig.8C

Fig.10A
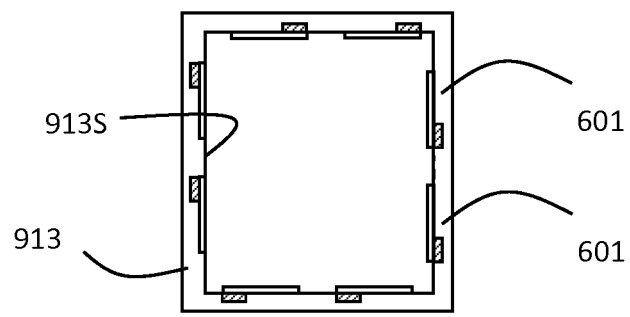
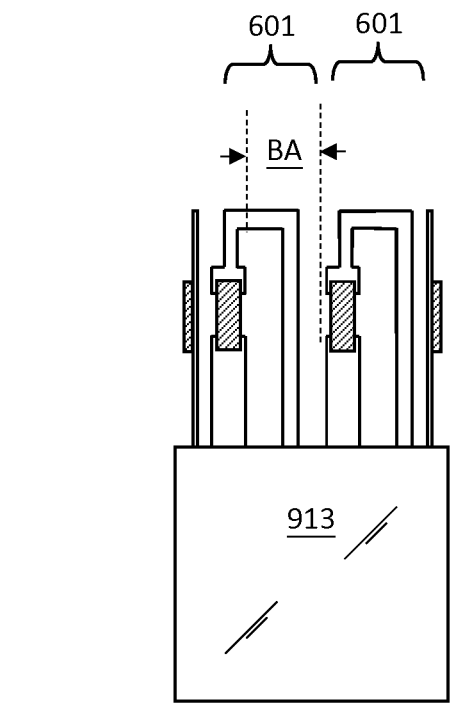
Fig.10B

Fig.12A
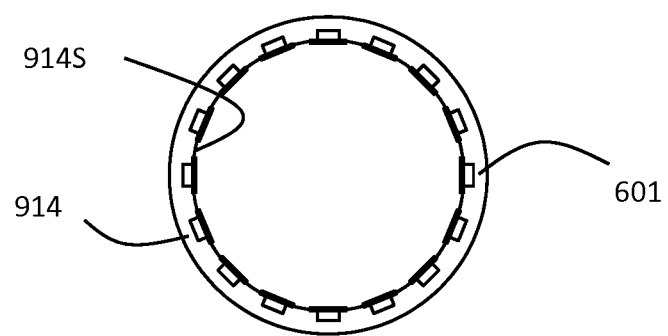
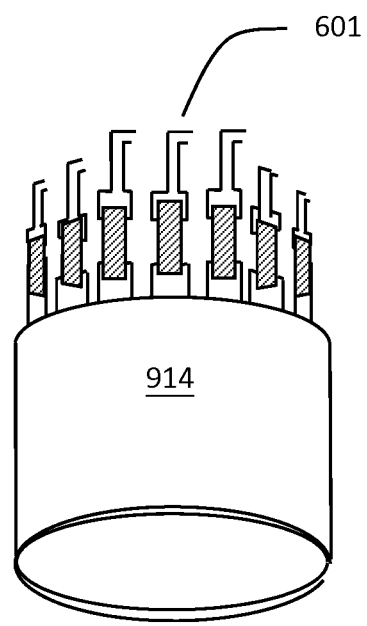
Fig.12B

Fig.13A
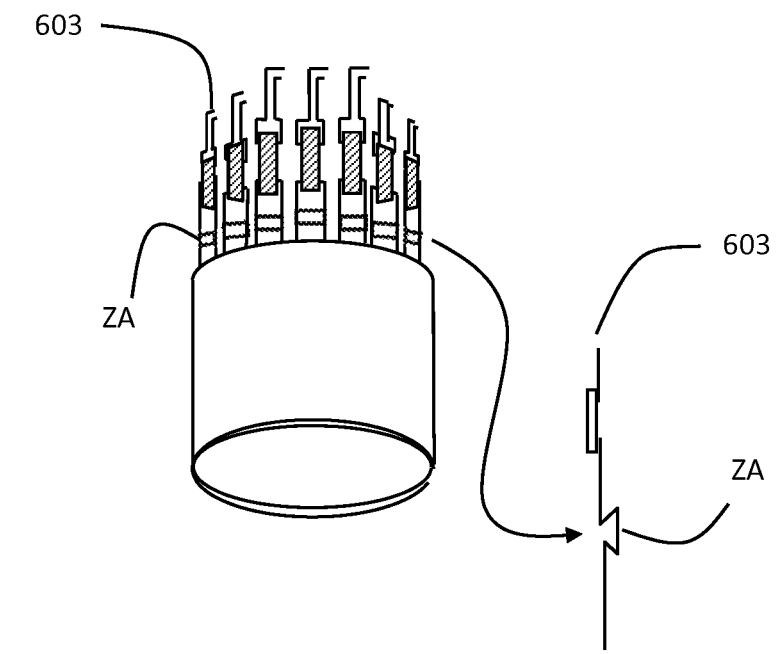
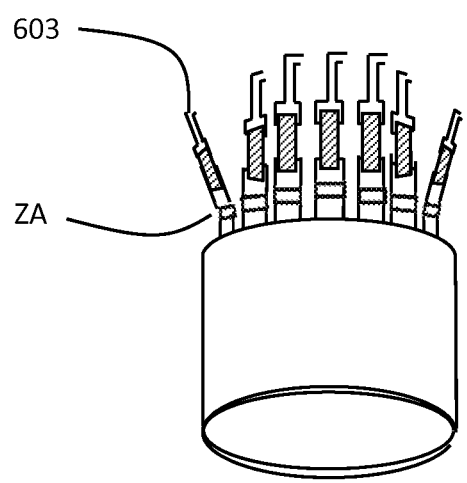
Fig.13B

Fig.14A
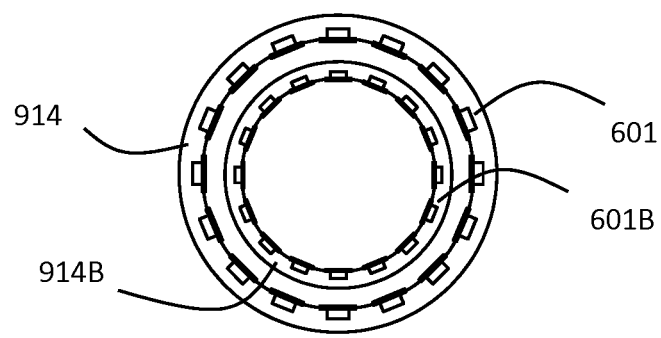
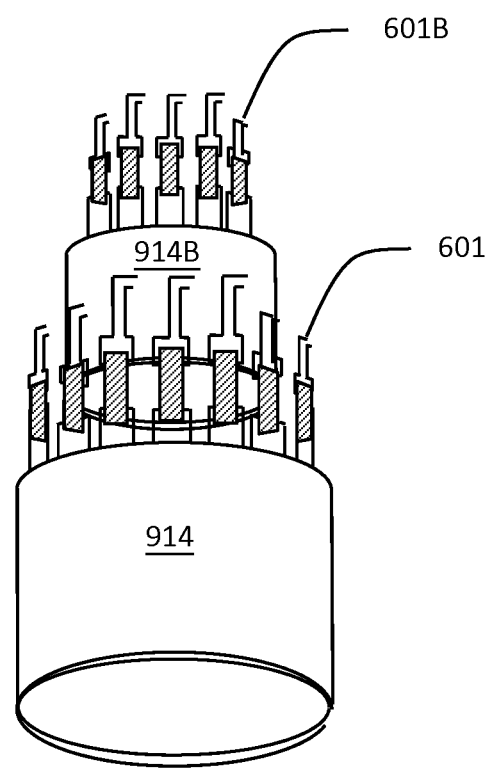
Fig.14B

Fig.15A
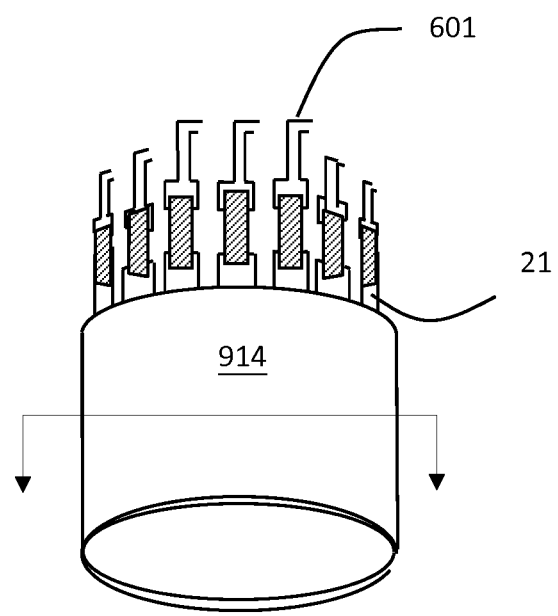
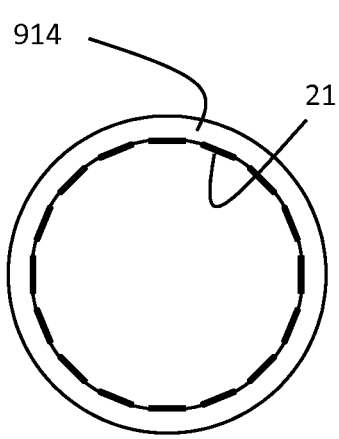
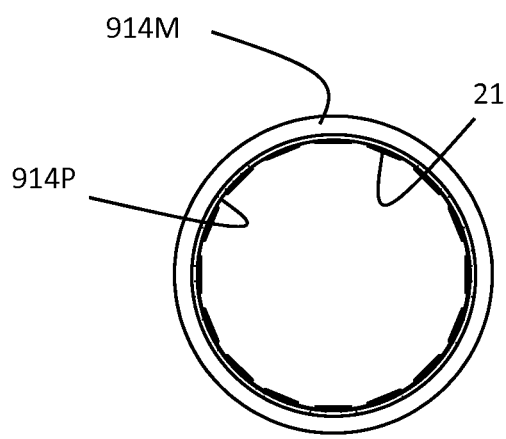
Fig.15B    Fig.15C

Fig.21A
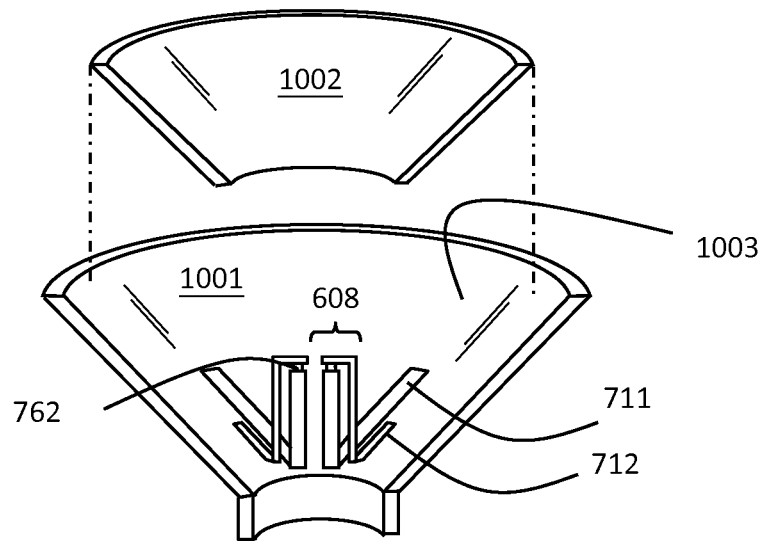
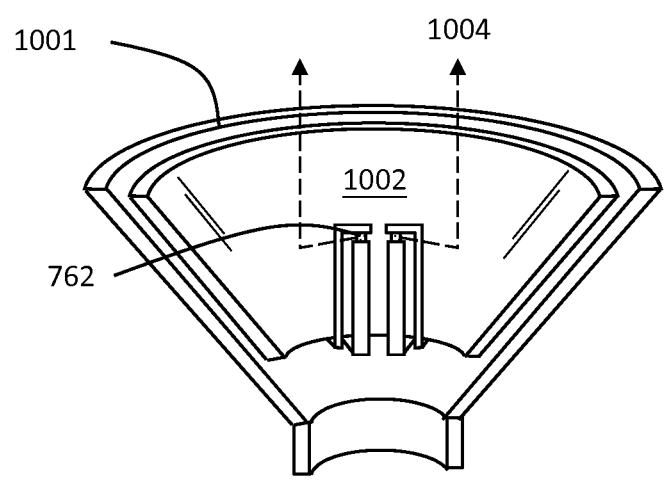
Fig.21B

LED LAMP

RELATED APPLICATION(S)

This application is a divisional application of application Ser. No. 13/231,214, filed Sep. 13, 2011, the entire disclosure of which is incorporated by reference herein.

BACKGROUND

1. Technical Field

The present invention relates to a lamp, especially to a lamp having a light unit which has a LED straddling a gap between two metal leads. The lower portion of the metal leads attaches to a heat sink for heat dissipation.

2. Description of Related Art

FIG. 1 is a prior art.

U.S. Pat. No. 7,434,964 discloses a LED lamp with a heat sink assembly which includes a plurality of LED module mounted on periphery of a heat sink 30. Each of the LED modules includes a plurality of LED 54 mounted on a front side of a circuit board 52. A plurality of heat pipe 40 is attached to the interior of the heat sink 30. A bowl-shaped cover 20 is attached to a bottom portion of the heat sink 30, a lamp seat 10 is secured below the cover 20. The bulky of the heat sink 30 makes the lamp heavy and the usage of the heat pipes 40 advances the cost of the lamp. A simpler LED lamp structure with better heat dissipation and cost down is desirous.

BRIEF DESCRIPTION OF THE DRAWINGS

FIG. 3A~3B is a second lead frame according to the present invention.

FIG. 4A~4B is a third lead frame according to the present invention.

FIG. 5A~5B is a fourth lead frame according to the present invention.

FIG. 6A~6B shows a flexible circuit for the lead frame according to the present invention FIG. 8A~8C shows a heat sink attached to the lead frame according to the present invention FIG. 10A~10B shows light beams emitted to different directions according to the present invention FIG. 12A~12B shows a modification to FIG. 11A~11B according to the present invention FIG. 13A~13B shows a modification to FIG. 12A~12B according to the present invention FIG. 14A~14B shows a modification to FIG. 12A~12B according to the present invention FIG. 15A~15C shows the heat sink used according to the present invention FIG. 21A~21B shows a third LED lamp according to the present invention

DETAILED DESCRIPTION

Figure 1:
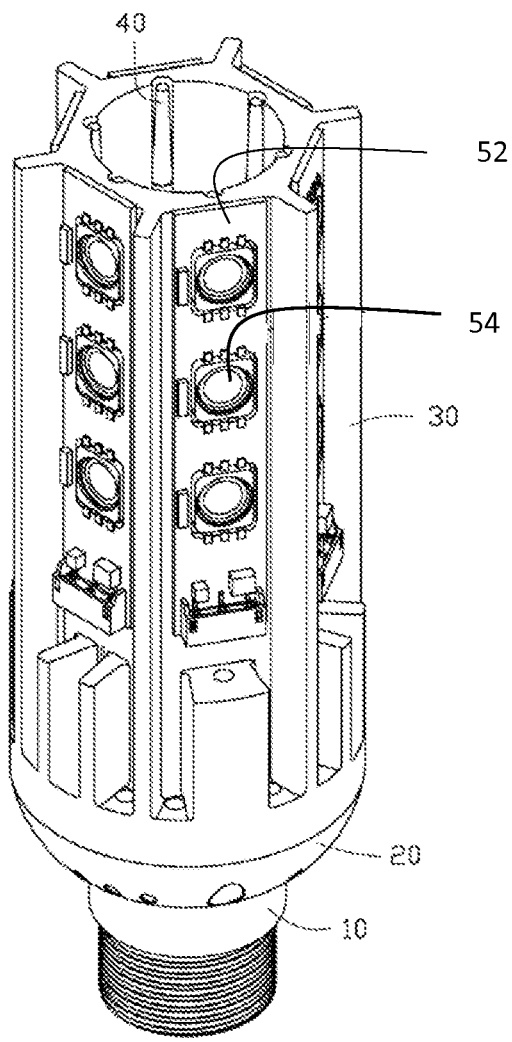
FIG. 1 is a prior art.
Figures 2A, 2B:
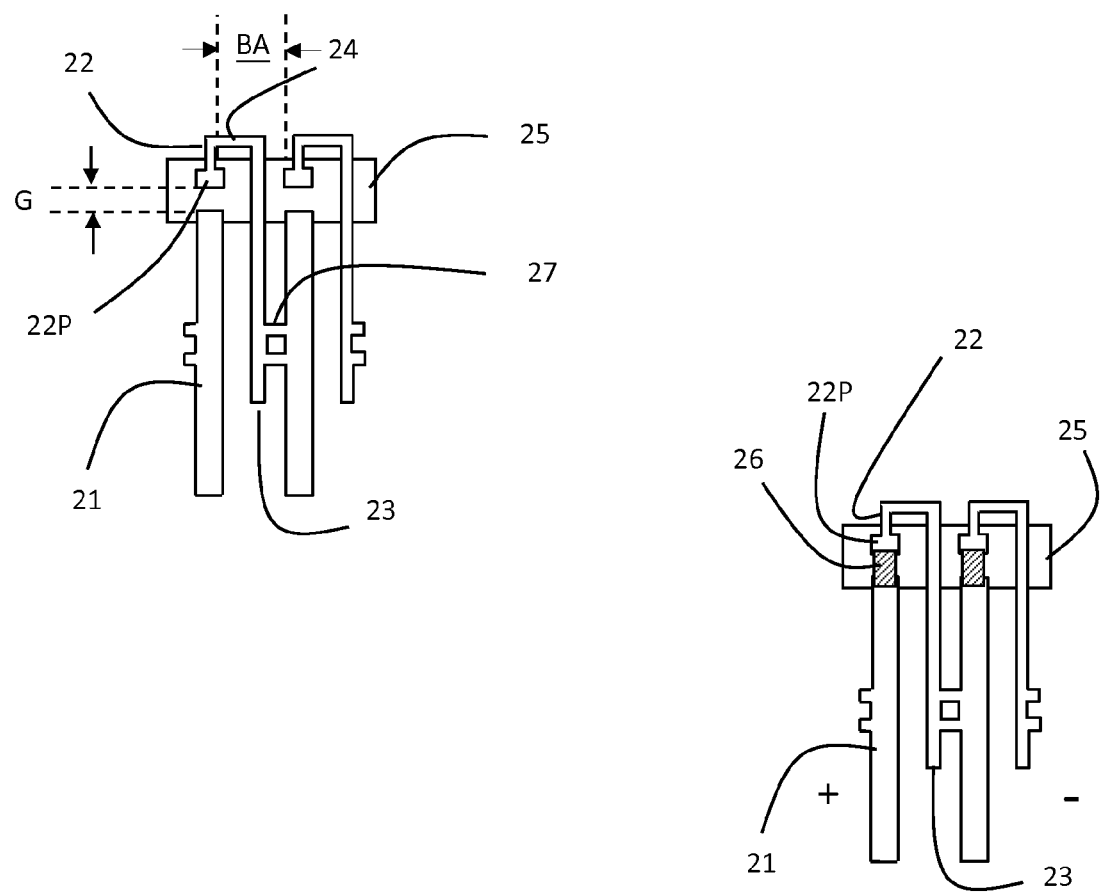
FIG. 2A~2B is a first lead frame according to the present invention.

FIG. 2A~2B is a first lead frame according to the present invention.

FIG. 2A discloses two lead frame units; each of the lead frame units has a flat longitudinal elongated metal lead 21; an angled metal lead which has a shorter longitudinal branch 22 with a metal pad 22P on bottom end aligned with the metal lead 21, a longer longitudinal branch 23, and a latitudinal branch 24 bridges the two branches 22, 23 on top. The longitudinal elongated metal 21 has a width no less than a width of a LED so that the LED can be easily attached onto it.

Figure 11A:
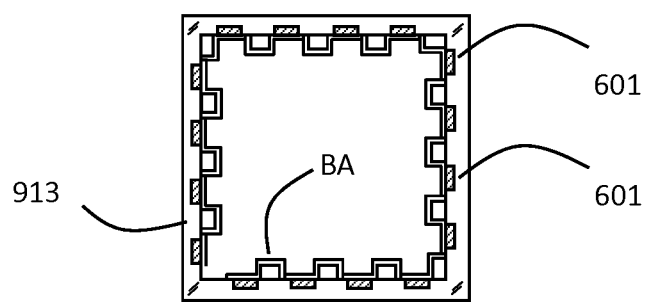
FIG. 11A~11B shows a modification to FIG. 10A~10B according to the present invention

A bendable area BA exists in the middle to right of the latitudinal branch 24 so that the longitudinal branch 23 can be bent backward to save the front side area and to advance the density of light units 601 in front side, see FIG. 11A vs. FIG. 10A.

A gap G is formed between the metal pad 22P and a top of the longitudinal elongated metal 21. The metal pad 22P has a front surface coplanar with the front surface of the metal lead 21 to facilitate the LED to mount.

During the preparation of the lead frame, a tape 25 can be used to fix the individual fragments of the lead frame from being separated. In the figure, the fixing tape 25 pastes on the back side of the lead frame. A pair of metal connection 27 is used to electrically coupling a neighboring unit in serial; the metal connection 27 is another bendable area in addition to the first bendable area BA. The metal connection 27 can be optionally cut off based on design choices such as if the neighboring light units are then controlled independently with a flexible circuit board (see FIG. 6A~6B) attached to the independent leads of the lead frame.

FIG. 2B shows a first light unit according to the present invention.

FIG. 2B shows that a LED 26 straddles the gap G of the lead frame of FIG. 2A, the LED 26 has a top end mounted on the metal pad 22P of the shorter longitudinal branch 22, and has a bottom end mounted on a top end of the longitudinal elongated metal 21. The LED 26 can be energized if the metal pad 22P and the longitudinal elongated metal 21 are electrically coupling to one of the electrodes of a power respectively, e.g. a positive electrode (+) connects to the longitudinal elongated metal 21, and a negative electrode (−) connects to the longitudinal branch 23 as shown in FIG. 2B.

FIG. 3A~3B is a second lead frame according to the present invention.

FIG. 3A discloses a pair of lead frame units; each of the lead frame units has a flat longitudinal elongated metal 31; an angled metal which has a longitudinal branch 33 and a latitudinal branch 34 extending from a top of the longitudinal branch 33. The longitudinal elongated metal 31 has a width no less than a width of a LED so that the LED can easily attach onto it. A bendable area BA exists in the middle to right of the latitudinal branch 34.

A gap G is formed between the latitudinal branch 34 and a top of the flat longitudinal elongated metal 31. The flat longitudinal elongated metal 31 has a width no less than a width of the LED so that the LED can easily attach onto it. The latitudinal branch 34 has a front side coplanar with the front side of the metal lead 31 to facilitate the LED to mount.

During the preparation of the lead frame, a tape 35 is used to fix the individual fragments of the lead frame from being separated. In the figure, the fixing tape 35 pastes on the back side of the lead frame.

FIG. 3B shows a second light unit according to the present invention.

FIG. 3B shows that a LED 36 straddles the gap G, the LED 36 has a top end mounted on the latitudinal branch 34 and has a bottom end mounted on the flat longitudinal elongated metal lead 31. The LED 36 can be energized if the flat longitudinal elongated metal lead 31 and the latitudinal branch 34 (or the longitudinal branch 33) are electrically coupling to one of the electrodes of a power respectively, e.g. a positive electrode (+) connects to the flat longitudinal elongated metal lead 31, and a negative electrode (−) connects to the longitudinal branch 33 as shown in FIG. 3B.

FIG. 4A~4B is a third lead frame according to the present invention.

FIG. 4A discloses a pair of lead frame units; each of the lead frame units has a flat longitudinal elongated metal lead 41; an angled metal which has a flat shorter longitudinal branch 42, a longer longitudinal branch 43, and a latitudinal branch 44 bridges the two branches 42, 43 on top. A bendable area BA exists in the middle to right of the latitudinal branch 44.

A gap G is formed between the flat shorter longitudinal branch 42 and a left top of the flat longitudinal elongated metal lead 41. The flat shorter longitudinal branch 42 has a front surface coplanar with the front surface of the flat longitudinal elongated metal lead 41 to facilitate a LED to mount onto them.

During the preparation of the lead frame, a tape 45 is used to fix the individual fragments of the lead frame from being separated. In the figure, the fixing tape 45 pastes on the back side of the lead frame. The top of the flat longitudinal elongated metal lead 41 is configured in a recess area enclosed by the flat shorter longitudinal branch 42, the latitudinal branch 44, and the longitudinal branch 43.

FIG. 4B shows a third light unit according to the present invention.

FIG. 4B shows that a LED 46 straddles the gap G, the LED 46 has a left end mounted on the flat shorter longitudinal branch 42, and has a right end mounted on a top end of the flat longitudinal elongated metal lead 41.

FIG. 5A~5B is a fourth lead frame according to the present invention.

FIG. 5A discloses a pair of lead frame units; each of the lead frame units has a first flat longitudinal elongated metal lead 511, a first angled metal having a second flat longitudinal elongated metal 512 with a first latitudinal branch 541 on top, and a second angled metal which has a longitudinal branch 53 and a latitudinal branch 542 extending from a top of the longitudinal branch 53. Both the first and the second flat longitudinal elongated metal lead 511, 512 have a similar width no less than a width of an LED so that the LED can easily attach onto it. The second angled metal has a width narrower than the width of either of the first or the second flat longitudinal elongated metal lead 511, 512 for material saving. A bendable area BA exists in the right portion of the latitudinal branch 542.

During the preparation of the lead frame, a tape 55 is used to fix the individual fragments of the lead frame from being separated. In the figure, the fixing tape 55 pastes on the back side of the lead frame.

A first gap G1 is formed between the first latitudinal branch 541 and a top of the first flat longitudinal elongated metal lead 511. A second gap G2 is formed between the second latitudinal branch 542 and the second flat longitudinal elongated metal lead 512.

FIG. 5B shows a fourth light unit according to the present invention.

FIG. 5B shows that a first LED 561 straddles the first gap G1, the LED 561 has a top end mounted on the first latitudinal branch 541 and has a bottom end mounted on the first flat longitudinal elongated metal lead 511. A second LED 562 straddles the second gap G2, the LED 562 has a top end mounted on the second latitudinal branch 542 and has a bottom end mounted on the flat longitudinal elongated metal lead 512.

FIG. 6A~6B shows a flexible circuit for the lead frame according to the present invention FIG. 6A shows that a first light unit 601 and a second light unit 602 are prepared. A flexible circuit board 62 is ready to mount on the metal leads of the light units 601, 602. A plurality of circuit 621 is made on the flexible circuit board 62; a metal contact 622 is made on a first end of each circuit 621. A second end of each circuit 621 electrically couples to a control system (not shown) for controlling the on/off of each and all LED.

FIG. 6B shows the assembly of FIG. 6A

FIG. 6B shows that the flexible circuit board 62 is attached to the metal leads of the light units 601, 602. Each of the metal contact 622 electrically couples to a corresponding one of the metal leads 61, 63.

Figure 7A:
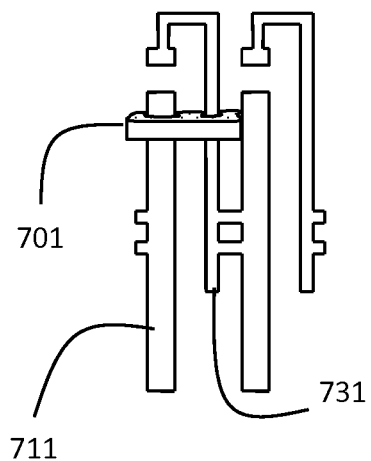
FIG. 7A~7B shows a molding compound fixing the lead frame according to the present invention
Figure 7B:
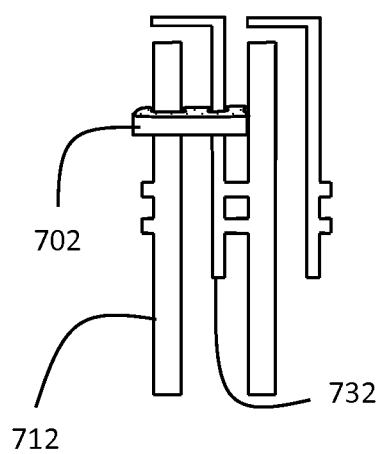

FIG. 7A~7B shows a molding compound fixing the lead frame according to the present invention FIG. 7A shows a molding compound 701 is used to fix the fragments of the first lead frame from being separated.

FIG. 7B shows a molding compound 702 is used to fix the fragments of the second lead frame from being separated. Similarly a molding compound can be used to fix the fragments of the lead frames of FIG. 4 and FIG. 5 but omitted herein the drawing.

FIG. 8A~8C shows a heat sink attached to the lead frame according to the present invention FIG. 8A shows a top view of FIG. 8C Firstly please referring to FIG. 8B, a heat sink 81 is ready to attach to the lower portion of the flat metal leads 21, 23 on which the LED 26 is mounted. FIG. 8C shows the heat sink 81 is mounted onto the front side of the metal leads 21, 23. FIG. 8A is a top view of FIG. 8C, FIG. 8A shows the heat sink 81 attaches to the metal leads 21, 23 for heat dissipation. The heat sink 81 is made of a ceramic; alternatively the heat sink 81 can be made of a metal while with an insulation material (see FIG. 15C) between it and the metal leads 21, 23.

Figure 9A:
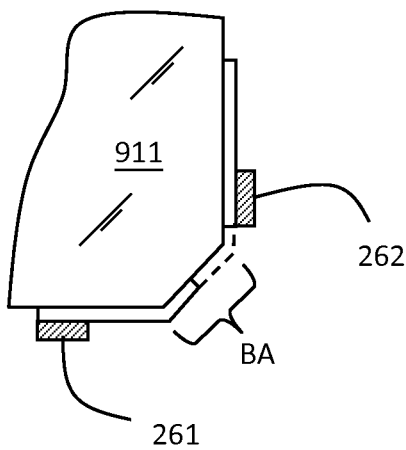
FIG. 9A~9B shows light beams emitted to different directions according to the present invention
Figure 9B:
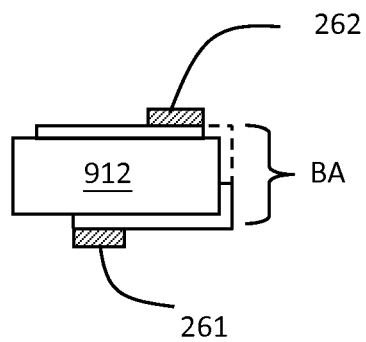

FIG. 9A~9B shows light beams emitted to different directions according to the present invention The bendable area BA of the lead frame can be bent for adjusting the direction to which the LED faces. FIG. 9A shows that the LED 261 faces a first direction and the LED 262 faces a second direction normal to the direction the LED 261 faces through bending of the bendable area BA. The heat sink 911 has a polygonal outline with different side surface adapted to attach to the lower portion of the flat metal leads 21, 23 of the lead frame units on which the LED 261, 262 mounted respectively.

FIG. 9B shows that the LED 261 faces a first direction and the LED 262 faces a second direction which is opposite to the direction the LED 261 faces. The heat sink 912 has a rectangular outline with opposite sides adapted to attach to the lower portion of the flat metal leads 21, 23 of the lead frame units on which the LED 261, 262 mounted respectively. The material for the heat sink can be ceramic or a metal with insulation inserted between it and the metal leads 21, 23.

FIG. 10A~10B shows light beams emitted to different directions according to the present invention FIG. 10A is a top view of FIG. 10B. Referring to FIG. 10A and FIG. 10B, a heat sink 913 with a rectangular wall is used; the heat sink 913 has an inner wall surface 913S. Each of the lower portion of the flat metal leads of eight light units 601 attaches to the inner wall surface 913S to form a lamp with light beams emitted to different directions.

Figure 11B:
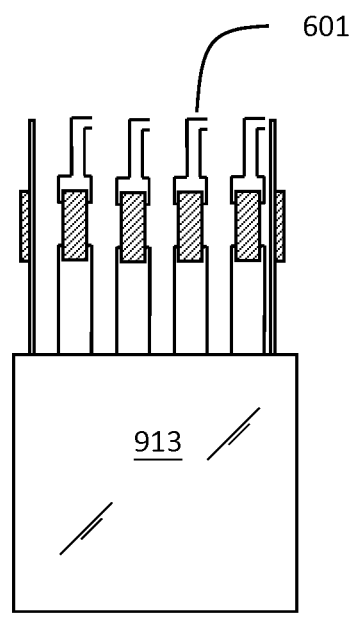

FIG. 11A~11B shows a modification to FIG. 10A~10B according to the present invention FIG. 11A is a top view of FIG. 11B. Referring to FIG. 11A and FIG. 11B, all the bendable area BA of the light units 601 are bent backward so that the density of the light units 601 can be higher in front side. FIG. 11A shows four light units 601 attached on each side and the quantity is twice as many as that shown in FIG. 10A where only two light units 601 attached on each side.

FIG. 12A~12B shows a modification to FIG. 11A~11B according to the present invention FIG. 12A is a top view of FIG. 12B. Referring to FIG. 12A and FIG. 12B, a heat sink 914 with a circular wall is used; the heat sink 914 has an inner wall surface 914S. Each of the lower portion of the metal leads of all the light units 601 attaches to the inner wall surface 914S to form a lamp with light beams emitted to full peripheral directions.

FIG. 13A~13B shows a modification to FIG. 12A~12B according to the present invention Each of the light unit 603 has a zigzag area ZA made in its longitudinal elongated metal lead, which makes the lead easier to bend. FIG. 13A shows a LED lamp with a plurality of light unit 603 upward. FIG. 13B shows some of the light units 603 are bent in the zigzag area ZA so that the LED can be adjust to face a different direction.

FIG. 14A~14B shows a modification to FIG. 12A~12B according to the present invention FIG. 14A is a top view of FIG. 14B. Referring to FIG. 14A and FIG. 14B, an outer heat sink 914 with a circular wall is used; the heat sink 914 has an inner wall surface to which each of the lower portions of metal leads of a plurality of light unit 601 is attached. An inner heat sink 914B similar to the outer heat sink 914 is inserted in the center of the outer heat sink 914, so that a second plurality of light unit 601B can be attached to the inner wall surface of the inner heat sink 914B.

FIG. 14B shows that the second plurality of light unit 601B is adjusted higher in a position than that of the first plurality of light unit 601 so that more light beams can be emitted from the whole lamp than the one as shown in FIG. 12A~12B.

FIG. 15A~15C shows the heat sink used according to the present invention

FIG. 15A shows a heat sink 914 is used in the lamp according to the present invention; a plurality of light unit 601 is attached to an inner wall surface of the heat sink 914.

FIG. 15B is a section view of a first embodiment to the heat sink 914. FIG. 15C is a section view of a second embodiment to the heat sink 914.

FIG. 15B shows that the heat sink 914 can be made of a ceramic material or equivalents for heat dissipation. FIG. 15C shows that the heat sink 914M is made of a metal with an insulation layer 914P configured on the inner wall surface so that the metal leads 21, 23 can be electrically insulated from the metal heat sink 914.

Figures 16A, 16B:
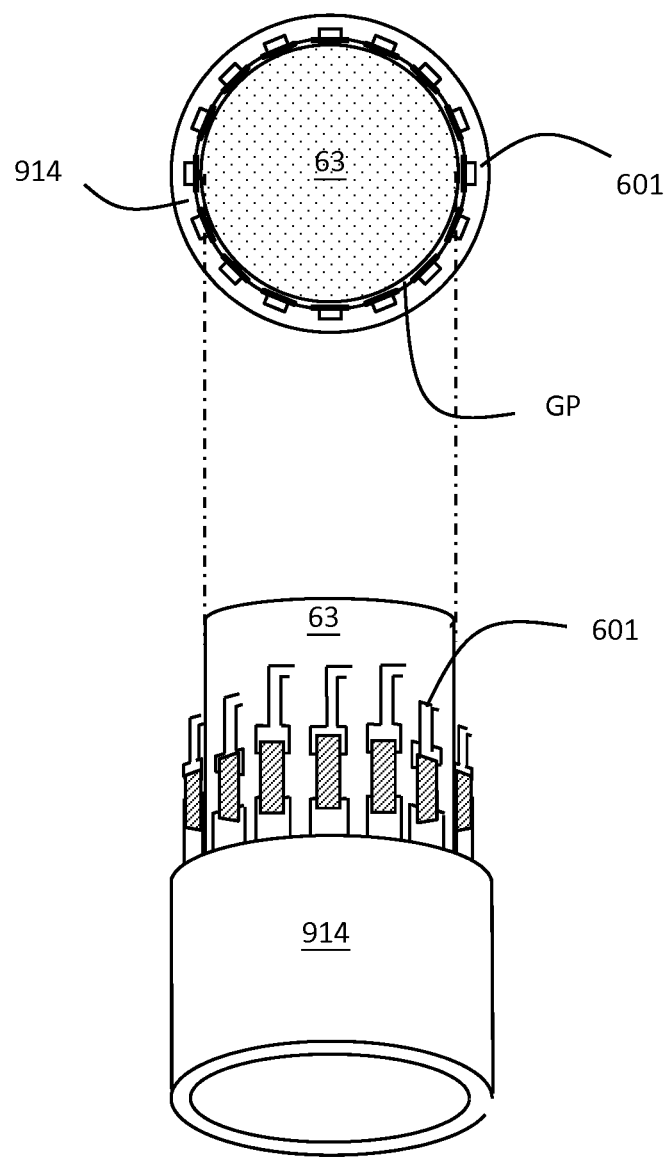
FIG. 16A~16B shows a center plug used according to the present invention

FIG. 16A~16B shows a center plug used according to the present invention

FIG. 16A is a top view of FIG. 16B. FIG. 16A shows a center plug 63 is inserted in a center of the circular wall heat sink 914. A circular gap GP is formed between the center plug 63 and the heat sink 914, so that the lower portion of the metal leads 21, 23 of the light units 601 can be firmly sandwiched in between and well electrically attached to the wall surface of the heat sink 914 for heat dissipation.

Figures 17A, 17B:
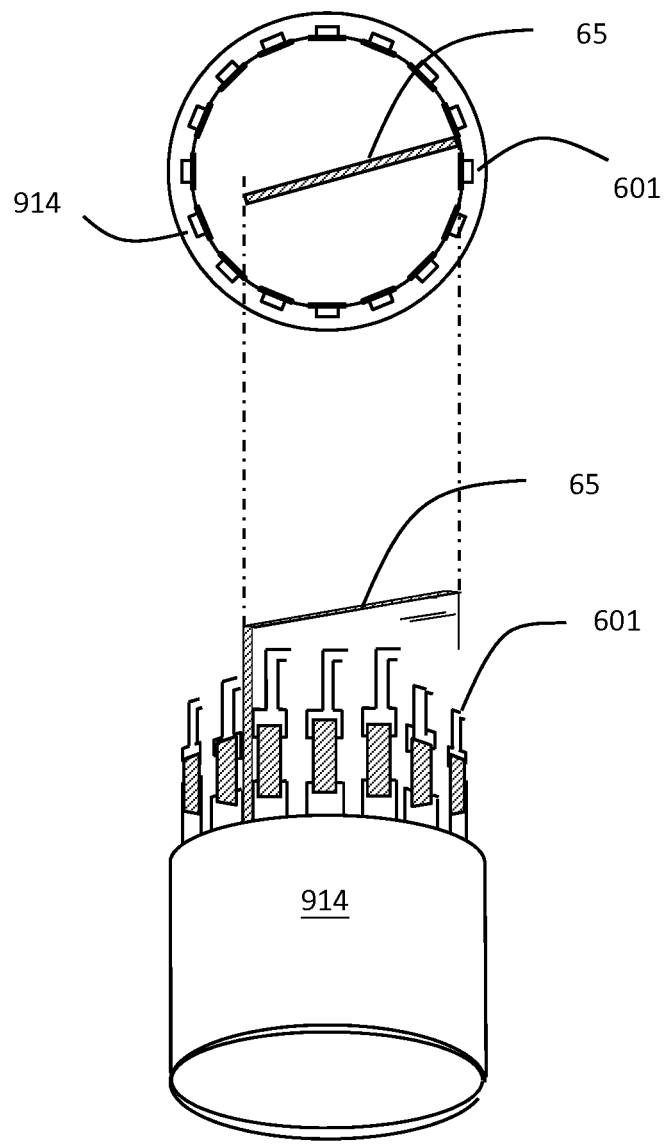
FIG. 17A~17B shows a circuit board used according to the present invention

FIG. 17A~17B shows a circuit board used according to the present invention

FIG. 17A is a top view of FIG. 17B. FIG. 17A~17B shows a circuit board 65 is inserted in a center of the circular wall heat sink 914 to electrically couple to each and all the light unit 601.

Figure 18:
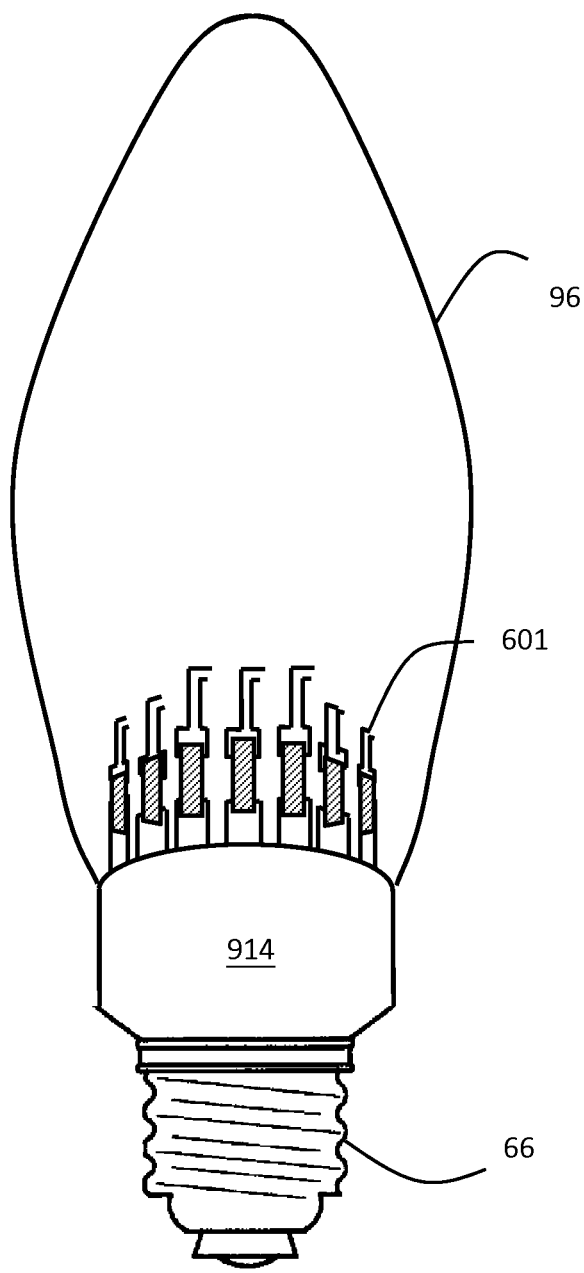
FIG. 18 shows a first LED lamp according to the present invention

FIG. 18 shows a first LED lamp according to the present invention

FIG. 18 shows an elliptical bulb 96 is configured on top of the heat sink 914. The bulb 96 encloses a plurality of light unit 601. At least one lead of each light unit 601 is attached to the inner wall surface of the heat sink 914. A lamp base 66 is configured on the bottom of the heat sink 914 so that the lamp can be mounted on a conventional lamp socket.

Figure 19:
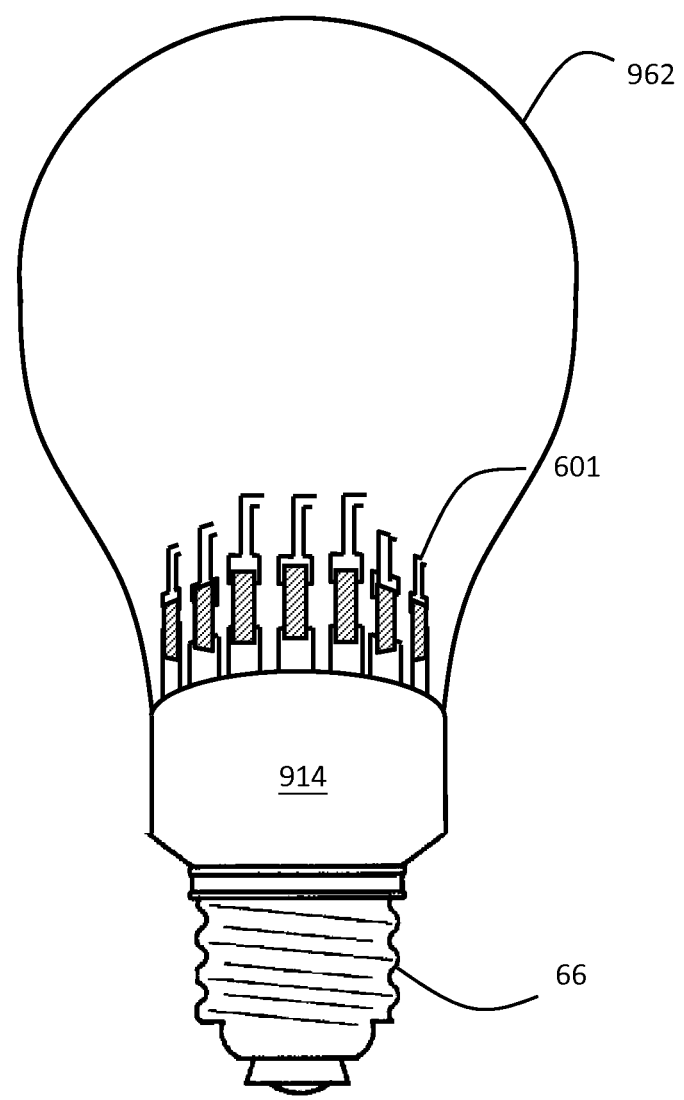
FIG. 19 shows a second LED lamp according to the present invention

FIG. 19 shows a second LED lamp according to the present invention

FIG. 19 shows a round bulb 962 is configured on top of the heat sink 914. The bulb 962 encloses a plurality of light unit 601. At least one lead of each light unit 601 is attached to the inner wall surface of the heat sink 914. A lamp base 66 is configured on the bottom of the heat sink 914 so that the lamp can be mounted on a conventional lamp socket.

Figure 20:
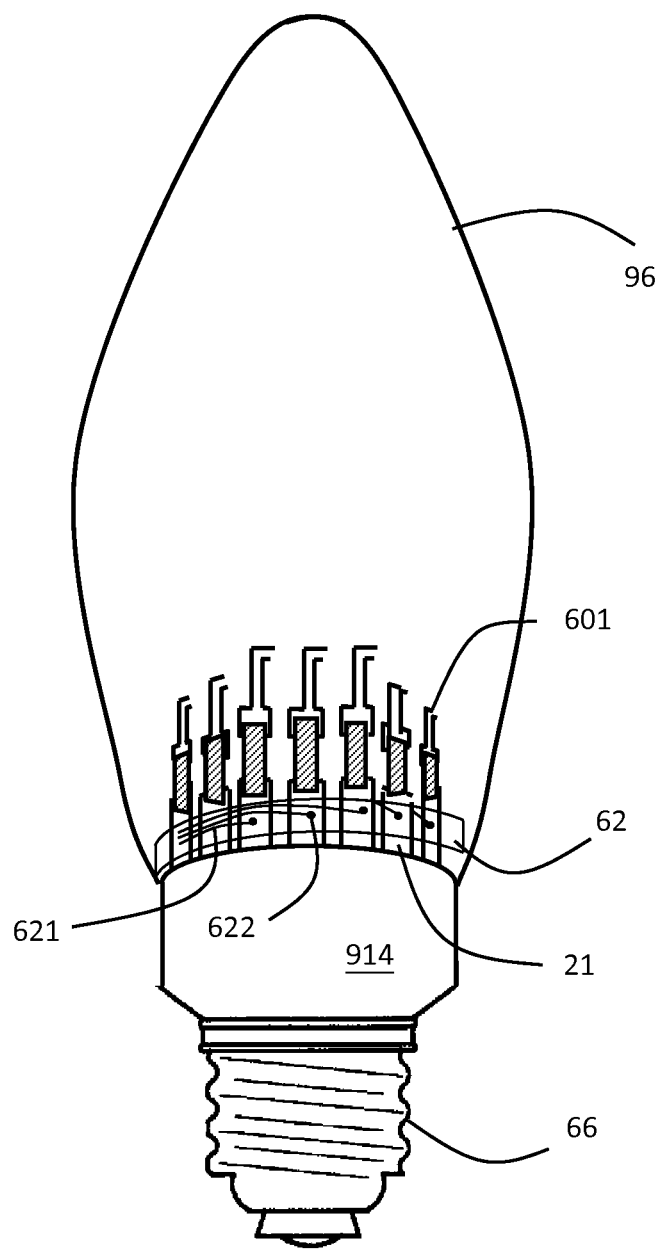
FIG. 20 shows a flexible circuit board used according to the present invention

FIG. 20 shows a flexible circuit board used according to the present invention

FIG. 20 shows a flexible circuit 62 attached to the flat metal lead 21 of each light unit 601. A plurality of circuit 621 are made on the flexible circuit board 62, a metal contact 622 is made on one end of each circuit 621 for electrically coupling to a corresponding one of the flat metal lead 21.

FIG. 21A~21B shows a third LED lamp according to the present invention

FIG. 21A is an exploded view of a third LED lamp. A cup-shaped heat sink 1001 has an inner surface 1003. A plurality of light unit 608 is mounted on the inner surface 1003 with metal leads 711, 712 bent on lower portion while maintains the upper portion of the light unit 608 upward so that some or all of the light beams of the LED 762 emits onto the inner surface 1003 before going out of the lamp.

A reflection cup 1002 is mounted on the inner surface 1003 with the lower portion of the elongated metal lead 711 sandwiched in between the two cups 1001, 1002 so that the light beams 104 are then reflected out of the cup through reflection cup 1002.

FIG. 21B shows the assembly of FIG. 21A.

FIG. 21B shows a LED 762 is mounted on an upper portion of metal leads 711, 712. Some or all of the light beams emitted from the LED 762 irradiated onto the surface of the reflection cup 1002 before going out of the lamp.

Figure 22A:
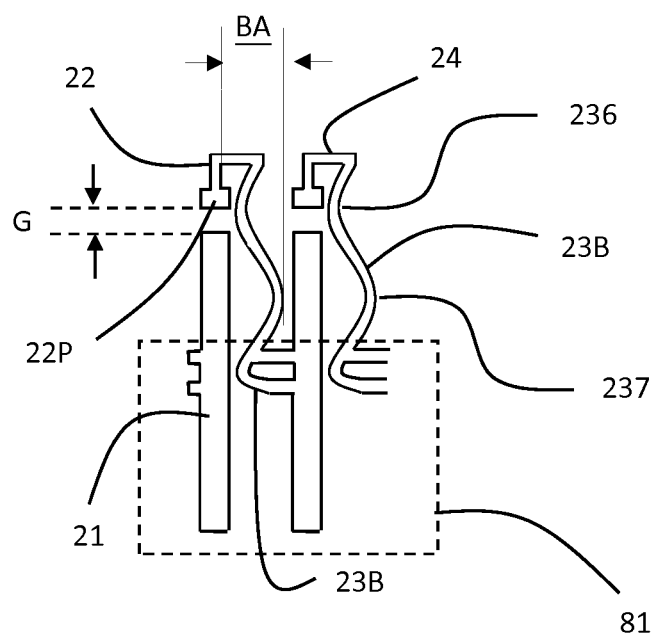
FIG. 22A~22B shows a further lead frame according to the present application.
Figure 22B:
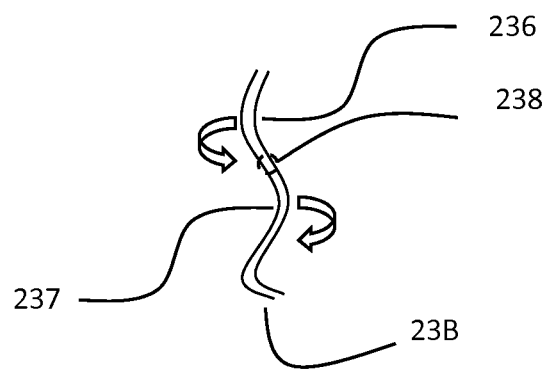

FIG. 22A~22B shows a further lead frame according to the present application.

FIG. 22A shows a further lead frame which can be used in the present application, the lead frame comprises: a flat longitudinal elongated metal lead 21, an angled metal which has a shorter longitudinal branch 22 with a lower end 22P aligned with the flat longitudinal elongated metal lead 21, a flat S-shaped branch 23B, and a latitudinal branch 24 bridging the two branches 22, 23B on top.

A gap G is formed between the lower end 22P of the shorter longitudinal branch 22 and a top of the flat longitudinal elongated metal lead 21. The S-shaped branch 23B provides much more bendable than a straight branch 23 as shown in FIG. 2A due to the bendable S curve itself. A LED can then straddle the gap and electrically couples to the metal leads.

FIG. 22B shows the bendable S-shaped metal

FIG. 22B shows the flat S-shaped metal 23B having a convex to the left 236 in the upper portion and a convex to the right 237 in the middle portion. While keeping the middle portion 238 between the two convexes 236, 237 stationary, the convex 237, 238 can be bent forward or backward relative to the middle portion 238.

A heat sink 81 is then attached to the lower portion of the flat metal leads 21, 23B for heat dissipation.

Figure 23:
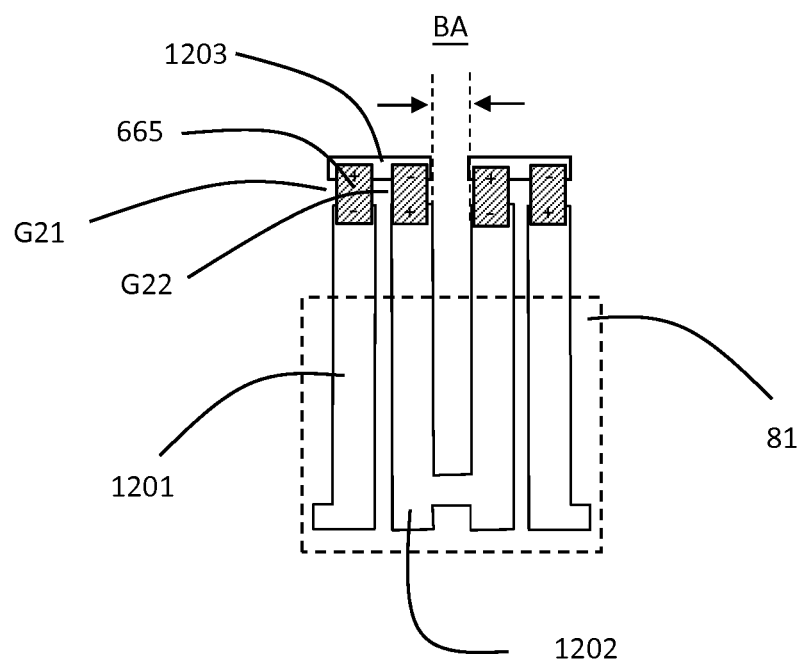
FIG. 23 shows a further lead frame according to the present application.

FIG. 23 shows a further lead frame according to the present application.

FIG. 23 shows a further lead frame which can be used in the present application, the lead frame comprises: a first flat metal lead 1201, a second flat metal lead 1202 having a front surface coplanar with a front surface of the first flat metal lead 1201, and a flat metal bar 1203 having a front surface coplanar with a front surface of the first flat metal lead 1201. A first gap G21 is formed between the flat metal bar 1203 and a top of the first flat metal lead 1201; a second gap G22 is formed between the flat metal bar 1203 and a top of the second flat metal lead 1202.

A first LED 665 straddles the first gap G21 and electrically couples to the first flat metal lead 1201 and the flat metal bar 1203. A second LED 665 straddles the second gap G22 and electrically couples to the second flat metal lead 1202 and the flat metal bar 1203.

A heat sink 81 is then attached to the lower portion of the flat metal leads 1201, 1202 for heat dissipation.

While several embodiments have been described by way of example, it will be apparent to those skilled in the art that various modifications may be configured without departing from the spirit of the present invention. Such modifications are all within the scope of the present invention, as defined by the appended claims.

What is claimed is:

1. A light emitting diode (LED) lamp, comprising:
   a first flat metal lead;
   a second flat metal lead, having a front surface coplanar with a front surface of the first flat metal lead;
   a flat metal bar, having a front surface coplanar with the front surfaces of the first and second flat metal leads;
   a first gap, formed between the flat metal bar and a top of the first flat metal lead;
   a second gap, formed between the flat metal bar and a top of the second flat metal lead;
   a first LED, straddled the first gap;
   a second LED, straddled the second gap; and
   a heat sink, attached to a lower portion of the first flat metal lead and the second flat metal lead.

2. The LED lamp as claimed in claim 1, wherein the heat sink has a shape selected from the group consisting of a polygon, a rectangle, a rectangular wall and a circular wall in a top view.

3. The LED lamp as claimed in claim 1, wherein the heat sink is made of ceramic material.

4. The LED lamp as claimed in claim 1, wherein the heat sink is made of metal and insulation material inserted between the metal of the heat sink and the metal leads.

5. The LED lamp as claimed in claim 1, further comprising:
   a third flat metal lead;
   a fourth flat metal lead, having a front surface coplanar with a front surface of the third flat metal lead;
   a further flat metal bar, having a front surface coplanar with the front surfaces of the third and fourth flat metal leads;
   a third gap, formed between the further flat metal bar and a top of the third flat metal lead;
   a fourth gap, formed between the further flat metal bar and a top of the fourth flat metal lead;
   a third LED, straddled the third gap; and
   a fourth LED, straddled the fourth gap.

6. The LED lamp as claimed in claim 5, wherein the heat sink is attached to a lower portion of the third flat metal lead and the fourth flat metal lead.

7. The LED lamp as claimed in claim 5, wherein the second flat metal lead is electrically connected to the third flat metal lead.

8. The LED lamp as claimed in claim 5, further comprising:
   a connecting portion physically and electrically connecting the second flat metal lead and the third flat metal lead, the connecting portion corresponding to a bendable area between the second flat metal lead and the third flat metal lead.

9. The LED lamp as claimed in claim 8, wherein the connecting portion, the second flat metal lead and the third flat metal lead are integrally formed of a flat metal.

10. The LED lamp as claimed in claim 8, wherein the connecting portion connects the lower portion of the second flat metal lead and a lower portion of the third flat metal lead.

11. The LED lamp as claimed in claim 10, wherein the heat sink is attached over the connecting portion, the lower portion of the second flat metal lead and the lower portion of the third flat metal lead.

12. The LED lamp as claimed in claim 11, wherein the heat sink is further attached to a lower portion of the fourth flat metal lead.

13. The LED lamp as claimed in claim 5, wherein the first through fourth LEDs are electrically connected in series by the flat metal bars, the second flat metal lead and the third flat metal lead.

* * * * *